(12) United States Patent
Lodholz et al.

(10) Patent No.: US 10,506,741 B2
(45) Date of Patent: Dec. 10, 2019

(54) ELECTRONIC COMPONENT COOLING

(71) Applicant: TRUMPF Huettinger GmbH + Co. KG, Freiburg (DE)

(72) Inventors: Roland Lodholz, Ebringen (DE); Christian Wunderle, Stegen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 16/111,443

(22) Filed: Aug. 24, 2018

(65) Prior Publication Data
US 2019/0021187 A1     Jan. 17, 2019

Related U.S. Application Data

(63) Continuation of application No. 14/969,690, filed on Dec. 15, 2015, now Pat. No. 10,076,057, which is a continuation of application No. PCT/EP2014/063667, filed on Jun. 27, 2014.

(30) Foreign Application Priority Data

Jun. 28, 2013    (DE) ........................ 10 2013 212 724

(51) Int. Cl.
    *H05K 7/20*      (2006.01)
(52) U.S. Cl.
     CPC ..... *H05K 7/20272* (2013.01); *H05K 7/20254* (2013.01); *H05K 7/20509* (2013.01); *H05K 7/20927* (2013.01)

(58) Field of Classification Search
CPC ........... H05K 7/20254; H05K 7/20272; H05K 7/20509; H05K 7/20927
See application file for complete search history.

(56) References Cited

U.S. PATENT DOCUMENTS

| | | |
|---|---|---|
| 4,447,842 A | 5/1984 | Berg |
| 5,349,498 A | 9/1994 | Tanzer |
| (Continued) | | |

FOREIGN PATENT DOCUMENTS

| | | |
|---|---|---|
| DE | 102004012026 | 11/2005 |
| DE | 102007015859 | 11/2008 |
| (Continued) | | |

OTHER PUBLICATIONS

International Search Report for corresponding PCT Application No. PCT/EP2014/063667, dated Nov. 17, 2014, 3 pages.

*Primary Examiner* — Robert J Hoffberg
(74) *Attorney, Agent, or Firm* — Fish & Richardson P.C.

(57) ABSTRACT

A cooling device for cooling at least one electronic component, as well as an electronic assembly with a cooling device and an electronic component. The cooling device has at least one cooling body through which a cooling medium flows. The cooling device further includes a cooling plate defining a through recess in which the cooling body is arranged at least in part. A through recess is particularly easy to produce, so that the complete cooling device can be manufactured very cost effectively. At least one cooling pipe in direct contact with the cooling plate and/or the electronic component to be cooled transports cooling medium from and to the cooling body, so that the cooling device can effectively absorb heat generated at the electronic component.

18 Claims, 2 Drawing Sheets

(56) References Cited

U.S. PATENT DOCUMENTS

| | | | |
|---|---|---|---|
| 5,829,516 A * | 11/1998 | Lavochkin | F28F 1/22 |
| | | | 165/80.4 |
| 5,966,291 A | 10/1999 | Baumel | |
| 6,158,232 A | 12/2000 | Tsuji | |
| 6,588,647 B2 | 7/2003 | Yamada | |
| 6,594,149 B2 | 7/2003 | Yamada | |
| 6,785,135 B2 | 8/2004 | Ohmi | |
| 6,802,366 B1 * | 10/2004 | Dillon | B21C 37/155 |
| | | | 165/177 |
| 6,840,310 B2 | 1/2005 | Tonosaki | |
| 6,853,555 B2 * | 2/2005 | Fichera | H01L 23/473 |
| | | | 165/80.4 |
| 6,989,991 B2 * | 1/2006 | Barson | H01L 23/473 |
| | | | 165/80.4 |
| 6,999,314 B2 | 2/2006 | Tonosaki | |
| 7,092,255 B2 * | 8/2006 | Barson | H01L 23/473 |
| | | | 165/80.4 |
| 7,613,001 B1 | 11/2009 | Liu et al. | |
| 7,624,791 B2 | 12/2009 | Strobel et al. | |
| 8,358,505 B2 | 1/2013 | Toftloekke | |
| 8,488,321 B2 | 7/2013 | Brandenburg | |
| 8,966,759 B1 | 3/2015 | Romero | |
| 8,991,478 B2 | 3/2015 | Zaffetti et al. | |
| 9,003,649 B1 | 4/2015 | Romero | |
| 9,233,439 B2 | 1/2016 | Seo | |
| 9,341,418 B2 | 5/2016 | Arvelo | |
| 9,693,489 B2 | 6/2017 | Park | |
| 2005/0259396 A1 | 11/2005 | Barson et al. | |
| 2007/0217148 A1 | 9/2007 | Omnitz | |
| 2010/0236761 A1 | 9/2010 | Chou et al. | |
| 2011/0063802 A1 | 3/2011 | Chen et al. | |
| 2011/0315367 A1 | 12/2011 | Romero et al. | |
| 2012/0085520 A1 | 4/2012 | Pfaffinger | |
| 2015/0053388 A1 | 2/2015 | Arvelo | |
| 2015/0016851 A1 | 6/2015 | Albrecht | |
| 2016/0105998 A1 | 4/2016 | Lodholz et al. | |
| 2016/0338222 A1 | 11/2016 | Reeves | |

FOREIGN PATENT DOCUMENTS

| | | |
|---|---|---|
| DE | 102008059452 | 6/2010 |
| DE | 102009012042 | 9/2010 |
| DE | 202010014106 | 12/2010 |
| EP | 0603860 | 6/1994 |
| EP | 0942640 | 9/1999 |
| EP | 2372760 | 10/2011 |

\* cited by examiner

ELECTRONIC COMPONENT COOLING

CROSS-REFERENCE TO RELATED APPLICATIONS

This application is a continuation of and claims priority under 35 U.S.C. § 120 to U.S. application Ser. No. 14/969,690, filed on Dec. 15, 2015, which is a continuation of PCT Application No. PCT/EP2014/063667, filed on Jun. 27, 2014, which claimed priority to German Application No. DE 10 2013 212 724.3, filed on Jun. 28, 2013. The contents of these priority applications are hereby incorporated by reference in their entirety.

TECHNICAL FIELD

The invention relates to cooling electronic components, and a related electronic arrangement cooling device.

BACKGROUND

It is known to vent heat loss from electronic and electromechanical components by means of cooling devices. Some cooling devices have a cooling channel for this, through which a cooling medium flows. Such devices may be formed from a solid material such as copper.

To lower costs, solid cooling bodies may be arranged on cooling plates. To facilitate a simple arrangement of electronic components, cooling devices may have solid cooling bodies embedded in cooling plates. This can increase manufacturing costs for the cooling devices.

SUMMARY

Various embodiments of this invention can provide a cooling device that is cost effective to manufacture, on which electronic components can be easily arranged.

According to one aspect of the invention, a cooling channel through which a cooling medium flows is arranged or embodied at least partially in a cooling body, and a cooling plate defines through recesses in which the cooling body is at least partially arranged. By "through recess" we mean an opening through which components can be passed.

In some respects, the invention advantageously unites the effective cooling of a cooling body with the cost advantages and the weight advantages of a cooling plate. Simple and cost effective manufacture of the through recess in the cooling plate can keep production costs for the cooling device low. The cooling body can thereby also be kept relatively small, resulting in a material saving. The cooling plate itself can be manufactured from a cost effective material. Cooling body and electronic component can be arranged flexibly by selecting the position of the through recess.

At least some sections of the cooling channel can be arranged in the cooling body in the form of a pipe with any cross-section, preferably with a round or rectangular cross-section. Alternatively or in addition at least one section of the cooling channel can be designed in the cooling body in the form of a recess with any cross-section, preferably a round or rectangular cross-section.

The cooling body is preferably made from a solid material with high heat conductivity, such as copper. Aluminum may be used as the solid material to be more cost effective and lighter than copper. Aluminum is preferably also used for the first cooling plate.

The first through recess can be formed in the first cooling plate by means of a machining method such as milling or punching.

Following manufacture of the first through recess the cooling body can be arranged at least partially in the first through recess. The cooling body can be joined with the first cooling plate, such as by fasteners, solder, glue, welding, clamps or rivets.

The cooling body can thereby rest on the first cooling plate at least in sections. A particularly simple and cost effective manufacture of the cooling device involves arranging the complete cooling body within the first through recess.

The entire cooling device is preferably substantially plate-shaped, so that it can be easily fitted into a housing or a frame for electronic components, such as a rack.

An outer surface of the cooling body can be lower or higher than an outer cooling surface of the cooling plate. In a particularly preferred design the cooling body has an outer surface that is at least partially co-planar with an outer surface of the cooling plate. The electronic component to be cooled can thus be arranged level on this surface of the cooling device.

The cooling device can include a cooling pipe in fluid connection with the cooling channel. In this way the cooling body can be easily supplied with a cooling medium, such as water. The cooling pipe can have any cross-section, but preferably has a round or rectangular cross-section.

To be able to remove large amounts of heat from the electronic component at least some sections of the cooling channel and/or the cooling pipe can be designed in a meandering path. In this way the surface of the cooling device in contact with the cooling medium can be increased.

At least some sections of the cooling pipe are preferably arranged or designed on the cooling plate. The cooling pipe cooled by the cooling medium can directly absorb and remove heat from the cooling plate itself in this way. The cooling pipe can thereby be formed in part by a half-shell made of sheet metal and in part by the first cooling plate, with at least some sections of the half-shell being covered by the cooling plate (i.e. such that the combined cross-section forms a closed cooling pipe). The cooling pipe can be manufactured particularly cost effectively in this way.

The cooling pipe can have an exterior that has at least regions that are level or co-planar with the outer surface of the cooling plate. In this way the effective cooling surface of the cooling device can be enlarged by the cooling pipe exterior.

The cooling plate preferably also defines a second through recess in which at least some sections of the cooling pipe are arranged. The cooling pipe can in this case be brought into direct contact with the electronic component through the second through recess. The first through recess and the second through recess can thereby be separate from each other. Alternatively, the first through recess and the second through recess can be connected with each other.

The cooling device can include another cooling plate located opposite the first cooling plate, with the cooling body arranged or defined at least partially between the cooling plates. Air can circulate inside the cooling device interior, guaranteeing an even and time consistent temperature distribution of the cooling device.

One or both cooling plates can be made of sheet metal, in particular aluminum sheet metal. The cooling device can be produced particularly cost effectively and easily in this way.

The sheet metal can be shaped sheet metal. This means that the sheet metal can be bent away from a plane at least in some areas and thus extends on two different levels, and is therefore suitable for connection with other components. The cooling device can thus be adjusted to the dimensions of components and housings easily and cost effectively, and electrical connections can also be easily provided. The sheet metal can be a sheet metal shaped through bending, punching or pressing. Shapes can thus be manufactured very cost effectively.

One or both cooling plates can be made from sheet metal with thickness of less than or equal to 5 mm, preferably less than or equal to 3 mm. One or both cooling plates can be made from sheet metal with a thickness less than the thickness of the cooling body. For example, the thickness of the cooling plate(s) can be less than or equal to half the thickness of the cooling body. One or both cooling plates can be made from sheet metal with a thickness of less than the thickness of the cooling channel. For example, the thickness of the cooling plate(s) can be less than or equal to half the thickness of the cooling channel. One or both cooling plates can be made from sheet metal with a thickness of less than the thickness of the cooling device interior, such as less than or equal to half the thickness of the cooling device interior.

The cooling device can include a stack of cooling plates that form a through recess when joined together. An inner cooling plate arranged inside a stack of joined cooling plates can define recesses shaped in such a way that a cooling channel is formed by the recesses when all cooling plates are joined. The cooling plates of a stack can be glued, pressed, soldered or screwed to each other.

In a particularly preferred configuration at least some sections one cooling plate are formed parallel to the cooling plate, in particular completely parallel to the first cooling plate. The cooling device is easier to manufacture as well as simpler to insert into a shaft of a housing or rack in this way.

The manufacture of the cooling device is particularly cost effective when the second cooling plate is made of sheet metal, in particular of aluminum sheet metal.

The cooling body can be placed on the second cooling plate. This represents a very simple possibility of arranging the cooling body in the cooling device.

The cooling channel can be mechanically and thermally connected with the first as well as with the second cooling plate. The mechanical connection can be produced by means of welding, soldering, gluing, screwing, riveting or pressing, increasing both the mechanical load and thermal capacity of the cooling device at the same time.

At least some sections of an interior of the cooling channel can be formed by the second cooling plate, such as by a groove on the cooling body. The groove can for example be milled into the cooling body. The second cooling plate can then cover the groove in the cooling body, creating a cooling channel with a closed cross-section.

The cooling device is particularly easy to handle when designed as a compact unit including at least one side part for connecting the first cooling plate and the second cooling plate.

The side part is preferably made from sheet metal, such as from aluminum sheet metal.

The first cooling plate, the second cooling plate and/or the side part can be advantageously made as a unitary piece of material, such as from one or more repeatedly bent metal (e.g., aluminum) sheets. Preferably, at least two of the first cooling plate, the second cooling plate and the side part are formed as a single, unitary piece of material.

In some cases the first cooling plate, the second cooling plate and the side part are all formed together as a single part.

The cooling device can be designed in such a way that at least the first cooling plate is formed as a single part with a side part, in which the first cooling plate is shaped in such a way that the side part extends on another plane than other parts of the first cooling plate, in particular on a plane that extends vertically to the plane of other parts of the first cooling plate.

The cooling device can be designed in such a way that at least the second cooling plate is formed as a single part with a side part, in which the second cooling plate is shaped in such a way that the side part extends on different plane from other parts of the second cooling plate, in particular on a plane that extends vertically to the plane of other parts of the second cooling plate.

The cooling device can include at least one fitting for installing the cooling device in a rack and/or for installing an electronic component on the cooling device. For example, the first cooling plate, the second cooling plate and/or the side part can include at least one bore, a threaded hole, a bead or similar.

Another aspect of the invention features an electronic arrangement with a cooling device as described above, and an electronic component arranged on or in the cooling device.

The electronic component can be a high-frequency power converter unit. By a high-frequency power converter unit we mean a power converter that converts power of more than 500 W at frequencies of more than 1 MHz with regard to frequency, current and/or voltage. The cooling device can be made from a material that is very electrically and thermally conductive.

The cooling device can serve as an electronic reference potential, in particular as a ground connection for the high-frequency power converter unit.

A further electronic component can be arranged on the side of the cooling device that is opposite the first electronic component.

The cooling device can be designed as an electromagnetic shield between two electronic components arranged between two opposing sides of the cooling plate(s). Particularly good thermal characteristics as well as particularly good electromagnetic shielding may be obtained with this solid material construction type. Good thermal characteristics as well as similarly good electromagnetic shielding effects can be realized with a cooling plate made from sheet metal with a cooling body arranged in a through recess for high frequencies, in particular those of more than 1 MHz.

Another aspect of the invention features a method of manufacturing one of the cooling devices or electronic arrangements described above. For this the sheet metal can in particular be shaped through bending, punching or pressing.

Further characteristics and advantages of the invention result from the following detailed description of several embodiment examples of the invention, with reference to the drawing, showing the major details of the invention, and from the patent claims.

The features shown in the drawing should not necessarily be understood as being to scale and are illustrated in a way that makes the features of the invention clearly visible.

The schematic drawing shows embodiment examples of the invention, which are explained in more detail in the following description.

DETAILED DESCRIPTION

Figure 1:
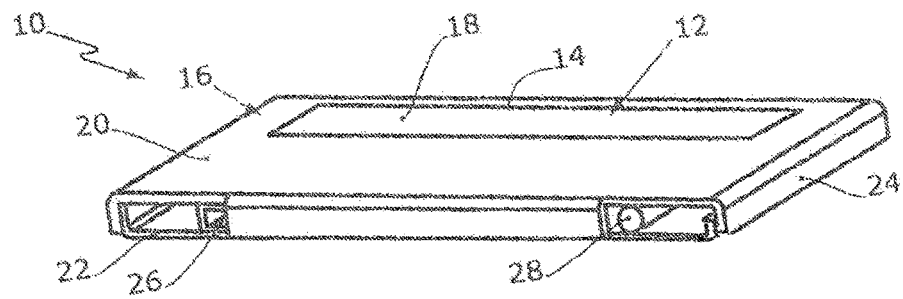
FIG. 1 is a perspective view of a first cooling device.

FIG. 1 shows a first cooling device 10 for cooling an electronic component (not shown). The first cooling device 10 comprises a cooling body 12. A cooling medium (not shown) in the form of water flows through the cooling body 12. The cooling medium is thereby guided by means of a cooling channel, not illustrated, through the otherwise solidly designed cooling body 12.

The cooling body 12 is arranged in a through recess 14 of a first cooling plate 16. An outer cooling body surface 18 of the cooling body 12 forms a co-planar surface with an outer cooling plate surface 20 of the first cooling plate 16. In other words, the outer cooling body surface 18 is designed level with the outer cooling plate surface 20. An electric component can therefore be placed level on the surface of the first cooling device 10 illustrated in FIG. 1.

The first cooling device 10 comprises a second cooling plate 22 and a side part 24. The side part 24 and the first cooling plate 16 are formed together as a single, unitary piece of material. The second cooling plate 22 also comprises a side part with which it forms a unitary piece of material. Both cooling plates 16, 22 are connected with each other via their side parts 24. Both cooling plates 16, 22 are made from aluminum sheet metal. The first cooling device 10 can therefore be manufactured very cost effectively. Both cooling plates 16, 22 can also be designed as a single part with the side part 24, see for example FIG. 2.

The first cooling device 10 includes a first cooling pipe 26 with a rectangular cross-section that is fluid-connected with the cooling channel of the cooling body 12. The cooling device 10 further includes a second cooling pipe 28 with a round cross-section, which is also fluid-connected with the cooling channel of the cooling body 12. The first cooling pipe 26 serves as an inlet to the cooling body 12, and the second cooling pipe 28 serves as its outlet. The cooling body 12 sits level on the second cooling plate 22. The second cooling plate 22 can be effectively cooled in this way.

Figure 2:
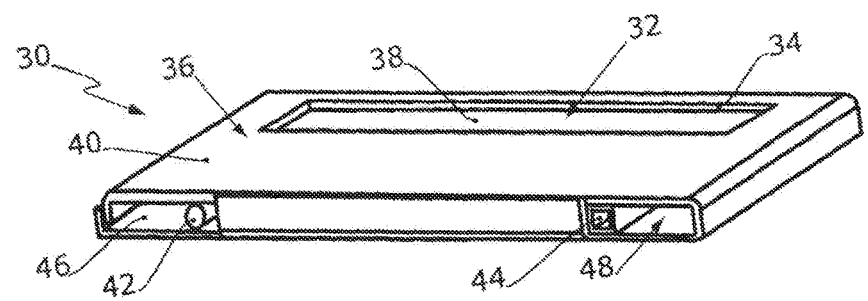
FIG. 2 is a perspective view of a second cooling device.

FIG. 2 shows a second cooling device 30. The second cooling device 30 is substantially identical to the first cooling device 10. The second cooling device 30 includes a cooling body 32 arranged in a through recess 34 of a first cooling plate 36. However, an outer cooling body surface 38 is arranged lower than a first outer cooling plate surface 40. A first cooling pipe 42, connected with the cooling body 32, has a round cross-section, while a second cooling pipe 44, connected with the cooling body 32, has a rectangular cross-section. The first cooling pipe 42 and the second cooling pipe 44 are both in direct thermal contact with both the first cooling plate 36 and a second cooling plate 46 of the second cooling device 30, so that heat exchange is possible for each cooling plate. The first cooling plate 36 and the second cooling plate 46 are formed as a single part via a side part. The cooling body 32 sits on the second cooling plate 46. Cooling device 30 is thus homogeneously cooled—despite the fact that it is not of a solid design. The first cooling plate 36 and the second cooling plate 46 together define a cooling device interior 48. The cooling device interior 48, accessible for ambient air, guarantees good ventilation of cooling device 30. Cooling device 30 can therefore be cooled by a fan when required.

Figure 3:
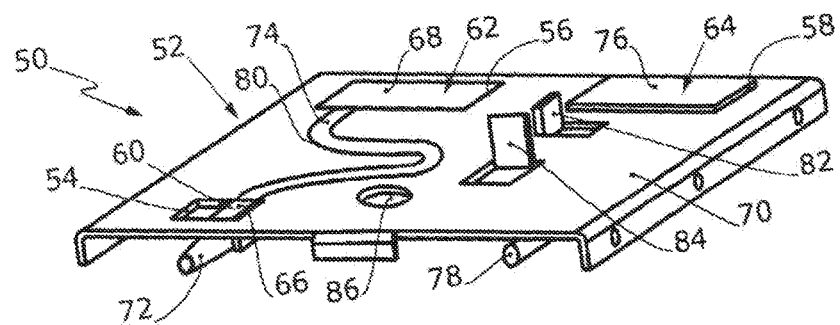
FIG. 3 is a perspective view of a third cooling device.

FIG. 3 shows a third cooling device 50 with a cooling plate 52. The cooling plate 52 defines a first through recess 54, a second through recess 56 and a third through recess 58. A first cooling body 60 is arranged in the first through recess 54, a second cooling body 62 in the second through recess 56, and a third cooling body 64 in the third through recess 58. An outer cooling body surface 66 of the first cooling body 60 as well as an outer cooling body surface 68 of the second cooling body 62 form a co-planar surface with an outer cooling plate surface 70 of the cooling plate 52.

The cooling bodies 60, 62, 64 are fluid-connected. A first cooling pipe 72 serves as an inlet to the first cooling body 60. The cooling medium is guided from the first cooling body 60 to the second cooling body 62 via a second cooling pipe 74. From there the cooling medium can be guided to the third cooling body 64 by means of a third cooling pipe not shown, which is arranged in such a way that an outer cooling body surface 76 of the third cooling body 64 is raised above the outer cooling plate surface 70. A fourth cooling pipe 78 serves as an outlet for the cooling medium from the third cooling body 64.

The second cooling pipe 74 is arranged in a fourth through recess 80 of the cooling plate 52, such that the second cooling pipe 74 forms a co-planar surface with the cooling plate 52. The second cooling pipe 74 therefore enables not only the transport of the cooling medium, but can also be used as a direct cooling surface itself. The first through recess 54 is connected with the fourth through recess 80 and the second through recess 56, so that a continuous cooling surface is provided by the first cooling body 60, the second cooling pipe 74 and the second cooling body 62.

Cooling device 50 further includes a first tab 82, a second tab 84 and a round fitting opening 86 for fitting an electronic component (not shown) and/or for fitting cooling device 50 to a housing (not shown).

Figure 4:
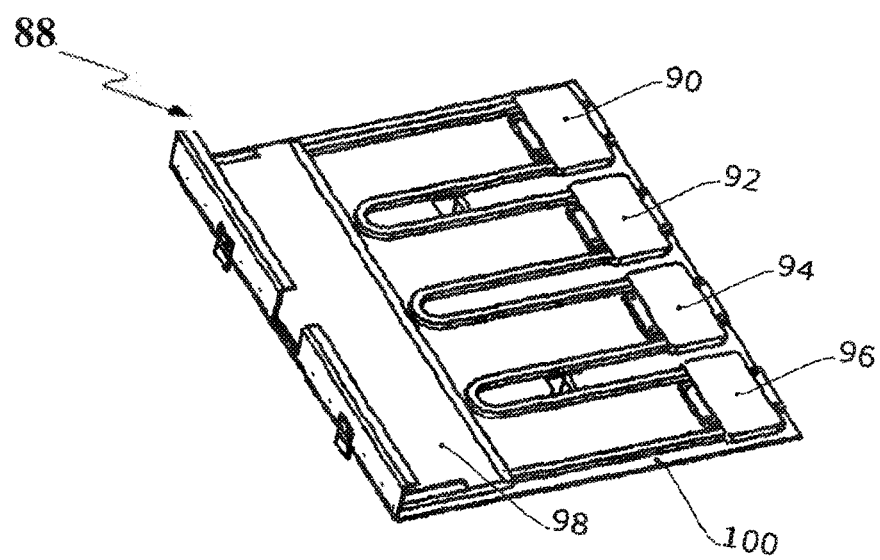
FIG. 4 is a perspective view of a fourth cooling device.

FIG. 4 shows the underside of a fourth cooling device 88. The fourth cooling device 88 includes five fluid-connected cooling bodies 90, 92, 94, 96, 98, which project into a cooling plate 100 (their top surfaces not visible in FIG. 4). The top of cooling device 88 can therefore be easily equipped with electronic components requiring cooling.

Figure 5:
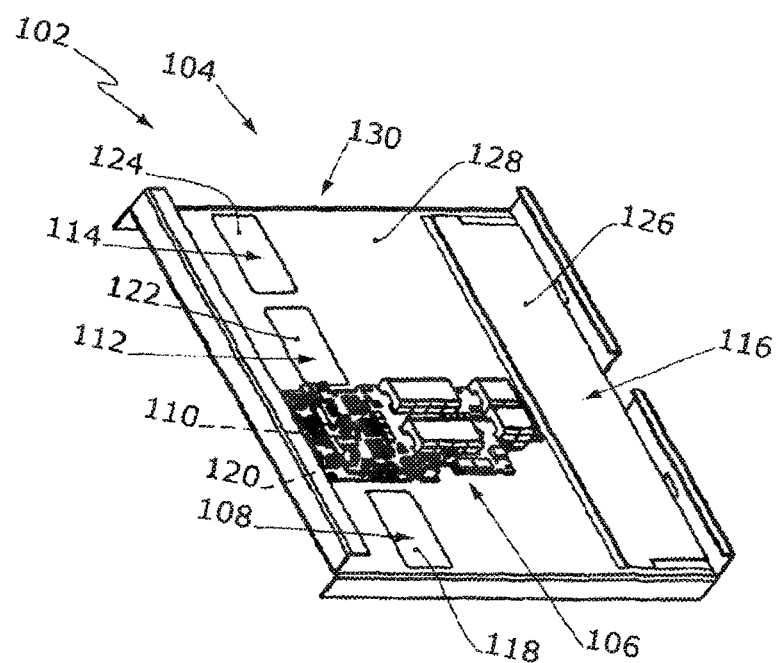
FIG. 5 is a perspective view of an electronic arrangement with a fifth cooling device.

FIG. 5 shows a top of an electronic arrangement 102 including a fifth cooling device 104 and an electronic component 106 in the form of equipped populated board. Cooling device 104 is the same—with the exception of the design of the fitting tabs—as the cooling device 88 shown in FIG. 4. Like cooling device 88, cooling device 104 includes five cooling bodies 108, 110, 112, 114, 116, with the electronic component 106 arranged on the cooling body 110. Outer cooling body surfaces 118, 120, 122, 124, 126 form a co-planar surface with an outer cooling plate surface 128 of a cooling plate 130. Further boards (not shown) can therefore be flexibly arranged on the top of cooling device 104. The cooling body 110 and its outer cooling body surface 120 are covered by the electronic component 106 and thus not visible. The lines of reference numbers 110 and 120 are therefore shown as broken lines.

Various examples of a cooling device for cooling at least one electronic component have been described, as well as an electronic arrangement with a cooling device and an electronic component. In each example the cooling device has at least one cooling body through which a cooling medium flows. The cooling device further includes a cooling plate defining a through recess in which the cooling body is arranged at least in part. A through recess is particularly easy to produce, so that the complete cooling device can be manufactured very cost effectively. At least one cooling pipe in direct contact with the cooling plate and/or the electronic component to be cooled is preferably provided for transporting the cooling medium from and to the cooling body, so that the cooling device can effectively absorb heat generated at the electronic component.

A number of embodiments of the invention have been described. Nevertheless, it will be understood that various modifications may be made without departing from the spirit and scope of the invention. Accordingly, other embodiments are within the scope of the following claims.

What is claimed is:

1. An electronic component cooler comprising:
   a first cooling plate;
   a second cooling plate disposed opposite the first cooling plate; and
   a cooling body connected to the first cooling plate and at least partially forming a cooling channel configured to contain a flow of cooling medium to remove heat from the cooling body;
   wherein the first cooling plate defines a first through recess in which the cooling body is at least partially disposed,
   wherein the cooling body is at least partially disposed in an interior formed between the first cooling plate and the second cooling plate, and
   wherein the first cooling plate is of shaped sheet metal.

2. The cooler of claim 1, wherein the cooling body has an outer surface that is at least partially co-planar with an outer surface of the first cooling plate.

3. The cooler of claim 1, further comprising a cooling pipe in hydraulic communication with the cooling channel.

4. The cooler of claim 1, wherein the second cooling plate is of sheet metal.

5. The cooler of claim 1, further comprising at least one side part connecting the first and second cooling plates at an edge of the cooler.

6. The cooler of claim 5, wherein at least two of the first cooling plate, the second cooling plate, and the side part are formed together as a single unitary piece of material.

7. The cooler of claim 6, wherein all three of the first cooling plate, the second cooling plate and the side part are formed together as a single unitary piece of material.

8. The cooler of claim 1, wherein the first cooling plate is formed as a single piece of shaped material with a side part that extends perpendicularly at an edge of the first cooling plate.

9. The cooler of claim 1, wherein the first cooling plate is formed as a single piece of bent sheet metal in which at least one portion of the sheet metal is bent out of a plane of the sheet.

10. The cooler of claim 1, wherein the first cooling plate is of sheet metal with a thickness of less than or equal to 5 mm.

11. The cooler of claim 1, wherein the first cooling plate is of sheet metal with a thickness less than a thickness of the cooling body.

12. The cooler of claim 1, wherein the first cooling plate is of sheet metal with a thickness less than a thickness of the cooling channel.

13. The cooler of claim 1, wherein portions of each of the first cooling plate and the second cooling plate are parallel to each other.

14. The cooler of claim 1, wherein the cooling channel is mechanically and thermally coupled with both of the first and second cooling plates.

15. An electronic assembly comprising
   the cooler of claim 1; and
   an electronic component thermally coupled to the cooler so as to remove heat from the electronic component.

16. The electronic assembly of claim 15, wherein the electronic component comprises a high-frequency power converter.

17. An electronic component cooler comprising:
   a cooling plate; and
   a cooling body connected to the cooling plate and at least partially forming a cooling channel configured to contain a flow of cooling medium to remove heat from the cooling body;
   wherein the cooling plate defines a first through recess in which the cooling body is at least partially disposed, and
   wherein the cooling plate is of shaped sheet metal with a thickness less than a thickness of the cooling channel.

18. An electronic component cooler comprising:
   a cooling plate; and
   a cooling body connected to the cooling plate and at least partially forming a cooling channel configured to contain a flow of cooling medium to remove heat from the cooling body;
   wherein the cooling plate defines a first through recess in which the cooling body is at least partially disposed, and
   wherein the cooling plate is of a single piece of bent sheet metal in which at least one portion of the sheet metal is bent out of a plane of the sheet.

* * * * *